(12) United States Patent
Cheng et al.

(10) Patent No.: US 12,389,813 B2
(45) Date of Patent: Aug. 12, 2025

(54) RESISTIVE SWITCHING MEMORY CELL

(71) Applicant: INTERNATIONAL BUSINESS MACHINES CORPORATION, Armonk, NY (US)

(72) Inventors: Kangguo Cheng, Schenectady, NY (US); Julien Frougier, Albany, NY (US); Ruilong Xie, Niskayuna, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 636 days.

(21) Appl. No.: 17/654,911

(22) Filed: Mar. 15, 2022

(65) Prior Publication Data

US 2023/0301213 A1    Sep. 21, 2023

(51) Int. Cl.
*H10N 70/00*    (2023.01)
*G06N 3/065*    (2023.01)
*H10B 63/00*    (2023.01)

(52) U.S. Cl.
CPC ........... *H10N 70/826* (2023.02); *H10B 63/80* (2023.02); *H10N 70/063* (2023.02); *H10N 70/8418* (2023.02); *H10N 70/8833* (2023.02); *G06N 3/065* (2023.01)

(58) Field of Classification Search
CPC ................................ H10N 70/00; H10B 63/00
See application file for complete search history.

(56) References Cited

U.S. PATENT DOCUMENTS

| | | |
|---|---|---|
| 8,520,425 B2 | 8/2013 | Li |
| 9,412,942 B2 | 8/2016 | Walls |
| 9,865,813 B2 | 1/2018 | Fest |
| 9,917,251 B2 | 3/2018 | Fest |
| 10,211,257 B2 | 2/2019 | Liu |
| 10,608,179 B2 | 3/2020 | Ando |
| 10,622,300 B2 | 4/2020 | Tu |
| 11,158,795 B2 | 10/2021 | Ando |
| 11,201,193 B2 | 12/2021 | Yang |
| 2020/0328346 A1 | 10/2020 | Kong |
| 2021/0098533 A1 | 4/2021 | Yang |

OTHER PUBLICATIONS

Pan, et al., "1Kbit FINFET Dielectric (FIND) RRAM in Pure 16nm FinFET CMOS Logic Process," IEEE International Electron Devices Meeting (IEDM), 2015, 1 page.

*Primary Examiner* — Marvin Payen
(74) *Attorney, Agent, or Firm* — Jeffrey Ingalls

(57) ABSTRACT

A resistive random access memory (ReRAM) device is provided. The ReRAM device includes a first electrode including a first conductive layer sandwiching a second conductive layer, the second conductive layer being wider than the first conductive layer; a resistive switching element layer formed in contact with sidewalls of the first electrode, a first portion of the resistive switching element layer that is in contact with the sidewalls of the first conductive layer having a width that is greater than a second portion of the resistive switching element layer that is in contact with the sidewalls of the second conductive layer; and a second electrode that is in contact with the resistive switching element layer.

20 Claims, 5 Drawing Sheets

RESISTIVE SWITCHING MEMORY CELL

BACKGROUND

The present disclosure generally relates to fabrication methods and resulting structures for semiconductor based electronic devices. More specifically, the present disclosure relates to a resistive random access memory (ReRAM) cell structure having an integrated access transistor and a high density layout for neuromorphic computing, the ReRAM cell having a resistive switching element layer.

ReRAM structures can be used as a type of non-volatile (NV) random-access memory (RAM) in computing resources. ReRAM devices having a simple metal-insulator-metal structure show promising characteristics in terms of scalability, low power operation, and multilevel data storage capability, and they may be suitable for next-generation memory applications. ReRAM typically operates by controlled changes in resistance across a dielectric solid-state material. The dielectric solid-state material may be referred to as a memristor. ReRAM may be considered as a promising technology for electronic synapse devices (or memristors) for neuromorphic computing as well as high-density and high-speed non-volatile memory applications. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of ReRAMs, which may enable a fully-connected neural network. Oxygen vacancies in a metal oxide layer of a ReRAM device are the building blocks of a current conducting filament.

SUMMARY

Embodiments of the present disclosure relate to a resistive random access memory (ReRAM) device. The ReRAM device includes a first electrode including a first conductive layer sandwiching a second conductive layer, the second conductive layer being wider than the first conductive layer; a resistive switching element layer formed in contact with sidewalls of the first electrode, a first portion of the resistive switching element layer that is in contact with the sidewalls of the first conductive layer having a width that is greater than a second portion of the resistive switching element layer that is in contact with the sidewalls of the second conductive layer; and a second electrode that is in contact with the resistive switching element layer.

Other embodiments relate to a method of fabricating a resistive random access memory (ReRAM) device. The method includes forming a first electrode including a first conductive layer sandwiching a second conductive layer, the second conductive layer being wider than the first conductive layer; forming a resistive switching element layer in contact with sidewalls of the first electrode, a first portion of the resistive switching element layer that is in contact with the sidewalls of the first conductive layer having a width that is greater than a second portion of the resistive switching element layer that is in contact with the sidewalls of the second conductive layer; and forming a second electrode that is in contact with the resistive switching element layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
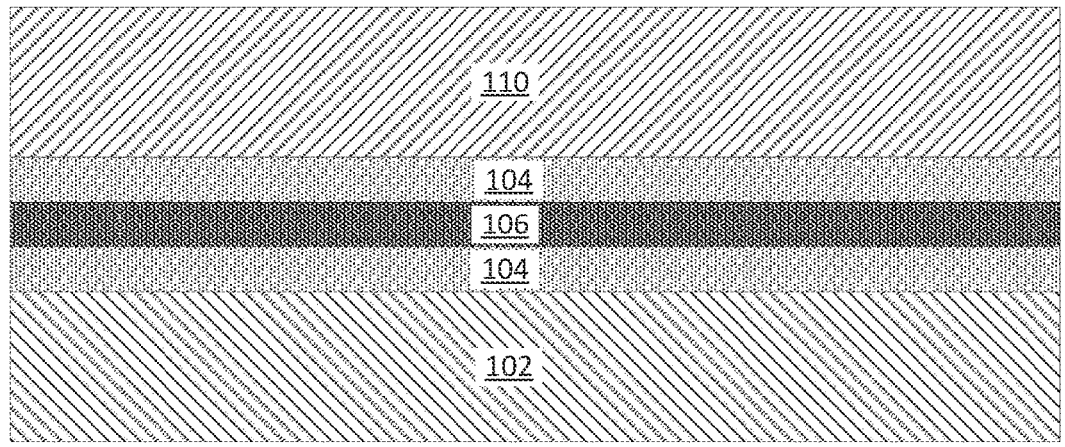
FIG. 1 is a cross-sectional view of a ReRAM device at an intermediate stage of the manufacturing process, according to embodiments.

The present disclosure generally relates to fabrication methods and resulting structures for semiconductor-based electronic devices. Certain embodiments relate to resistive random access memory (ReRAM) cell structures with an integrated access transistor and a high density layout that may be used in neuromorphic computing applications, and methods of fabricating such ReRAM devices. In particular, the present embodiments relate to a ReRAM device including a sandwiched conductive layer (e.g., a first electrode) including shell layers and a core layer, where the shell layers are selectively etched over the core layer to product a tip or protrusion in the core layer that allows for localizing the filament formation between the tip portion of the first electrode and the second electrode.

The flowcharts and cross-sectional diagrams in the Figures illustrate methods of manufacturing nanosheet ReRAM devices according to various embodiments. In some alternative implementations, the manufacturing steps may occur in a different order than that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure of a resistive memory device (e.g., a ReRAM device) that can be used as classic memory applications. The ReRAM device can also be used in neuromorphic computing applications in which each resistive memory device (e.g., a ReRAM device) can be used as a connection (synapse) between a pre-neuron and post-neuron, representing the connection weight in the form of device resistance.

Multiple pre-neurons and post-neurons can be connected through a crossbar array of RRAMs, which naturally expresses a fully-connected neural network.

A crossbar array of RRAM can be made with junction with resistively switching material formed on the bottom electrodes. The top electrodes are formed on the junction with resistively switching material to form a crossbar array of RRAMs.

Non-volatile resistively switching metal oxides, such as $HfO_x$, $TaO_x$, $AlO_x$, $ZrO_x$, $TiO_x$, or a combination of these materials are integrated into nano-crossbar arrays and nano-cross-points scaled down to a feature size by electron beam lithography. This enables a fast fabrication route for high density prototype test structures of passive memory cores with two terminal devices. The structures and the integrated material is electrically characterized to gain an insight into the general properties of nano-crossbar arrays with resistively switching metal oxides and to define the demands for an external CMOS control system.

Nonvolatile and resistively switching materials with two or more stable states such as $HfO_x$ are integrated as two terminal memory devices to efficiently create a ReRAM bit pattern. These cells can be integrated into crossbar arrays. The switching material can cover the whole chip area and every junction at a cross point is an addressable cell of a ReRAM. Since the array consists of passive elements, additional active external circuitry is required for the operation to address the cells, set, and reset their state and read the stored information.

Artificial neural networks (ANNs) can be formed from crossbar arrays of resistive processing units (RPUs) that provide local data storage and local data processing without the need for additional processing elements beyond the RPU. The trainable resistive crosspoint devices are referred to as RPUs.

The neurons are integrated in CMOS circuitry with cross bar array of devices, which stores a matrix. The input neurons, along with the hidden neuron layers and output neurons and input signals. The neurons states can be, for example, backward, forward and update.

Crossbar arrays (crosspoint arrays or crosswire arrays) are high density, low cost circuit architectures used to form a variety of electronic circuits and devices, including ANN architectures, neuromorphic microchips, and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which may be formed from thin film material. Crosspoint devices, in effect, function as the ANN's weighted connections between neurons. Nanoscales two-terminal devices, for example memristors having conduction state switching characteristics, are often used as the crosspoint devices in order to emulate synaptic plasticity with high energy efficiency. The conduction state (e.g., resistance) of the memristive material may be altered by controlling the voltages applied between individual wires of the row and column wires.

The Resistive Processing Unit (RPU) can further enhance the functionality of neuromorphic computing. The new class of devices (RPU) that can be used as processing units to accelerate various algorithms including neural network training.

In certain of the present embodiments, in oxide ReRAM cell structures, the devices include a metal oxide layer positioned between a first electrode and a second electrode (i.e., a metal-insulator-metal structure). Oxygen vacancies in the metal oxide layer allow for the electroformation of a current conducting filament (CF) therein. In many ReRAM devices, the mechanism enabling the storage of information is based on the formation and rupture of this CF formed between the two electrodes, resulting in repeatable resistive switching between high resistance states (HRS) and low resistance states (LRS). With regard to the CF, when an oxide metal is sandwiched between two electrodes, when a sufficient positive voltage is applied to the first electrode, the CF will form between the two electrodes, resulting in a low resistance state. In contrast, when a sufficient negative voltage is applied to the second electrode, the CF breaks, resulting in a high resistance state. In certain embodiments of the oxide ReRAM device, the formation of the CF is triggered by field-assisted oxygen ion migrations, resulting in a change in the electronic conductivity (or resistivity) of the switching device, as discussed above. For oxide ReRAM devices, the electroforming of the CF is needed.

The process of forming the conductive filament may rely on a certain amount of randomness and the position of the created filament may not always be well controlled. This may result in the need for a higher forming voltage as the ReRAM cell is scaled, and this may lead to higher device variability. In certain ReRAM devices of the present embodiments, the devices may have a relatively lower ReRAM forming voltage. Moreover, the ReRAM cells may have an improved uniformity by localizing the filament formation between a tip portion of a first electrode and a second electrode.

Referring now to the drawings in which like numerals represent the same or similar elements and initially to FIG. 1, this figure is a cross-sectional view of a ReRAM device in an intermediate stage of the manufacturing process, in accordance with certain embodiments. As shown in FIG. 1, a base semiconductor substrate 102. In certain embodiments, the semiconductor substrate 102 includes a semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or another like semiconductor. In addition, multiple layers of the semiconductor materials can be used as the semiconductor material of the substrate. The semiconductor substrate can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer. There may be any suitable number of intermediate layers between the substrate 102 and the first metal layer 104, and in FIG. 1 the substrate 102 is shown as the bottom layer for the sake of simplicity and ease of illustration. The substrate 102 may also include one or more other devices such as transistors, diodes, capacitors, interconnects, isolation structures, contacts, wires, etc.

As shown in FIG. 1, a tri-layer metal structure is formed on the substrate 102. A second metal layer 106 is sandwiched between two first metal layers 104. The first metal layer 104 may comprise, for example, tantalum nitride (TaN) or titanium aluminum carbide (TiAlC). The second metal layer 106 may include, for example, a titanium rich (Ti-rich) compound conductive material such as Ti-rich titanium nitride (TiN). It should be appreciated that other suitable materials may be used for the first metal layer 104 and the second metal layer 106. In certain embodiments, the materials for the first metal layer 104 and the second metal layer 106 are selected such that the first metal layer 104 can be selectively etched relative to the second metal layer 106. In an example, a thickness of the second metal layer 106 is about 3 nm and it can be used as a first electrode (hereinafter referred to as "top electrode") for the ReRAM. However, it should be appreciated that other suitable thicknesses of the second metal layer 106 may also be used. In certain examples, the thickness of the first metal layers 104 (i.e., the two layers sandwiching the second metal layer 106) may have a thickness of, for example, less than about two times a thickness of the resistive switching element (e.g., the $HfO_x$ layer discussed below). For example, the thickness of the resistive switching element is about 5 nm, the thickness of the first metal layers 104 should be less than about 10 nm. However, it should be appreciated that other suitable thicknesses of the first metal layer 104 may also be used. As also shown in FIG. 1, a hardmask 110 is then deposed over the entire surface of the upper portion of the first metal layer 104 (i.e., the top layer of the first metal layer 104). The hardmask 110 may comprise silicon nitride (SiN), or any other suitable material.

Figure 2:
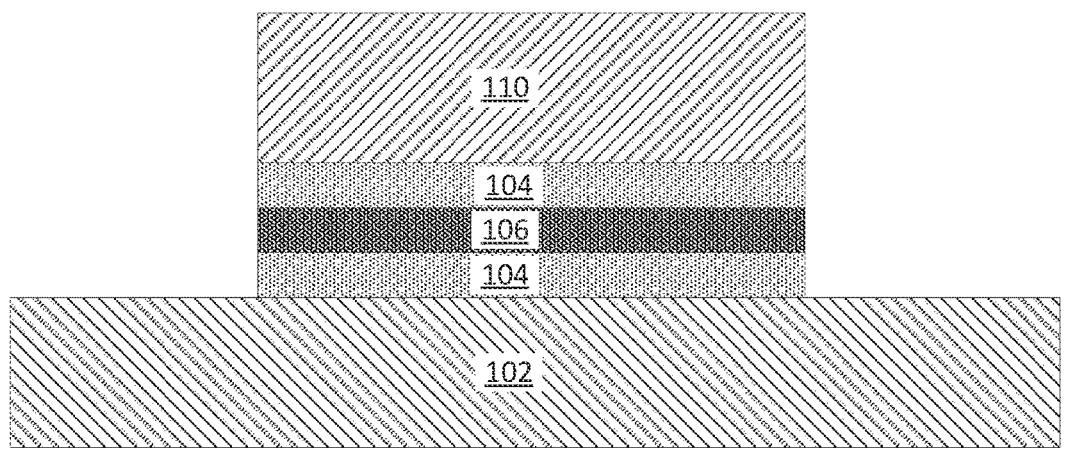
FIG. 2 is a cross-sectional view of the ReRAM device of FIG. 1 at a subsequent stage of the manufacturing process, according to embodiments.

Referring now to FIG. 2, this figure is a cross-sectional view of the ReRAM device 100 of FIG. 1 at a subsequent stage of the manufacturing process, according to embodiments. As shown in FIG. 2, patterning is performed on the hardmask 110, the first metal layers 104 and the second metal layer 106 to form these layers into tri-layer metal structure of the ReRAM device 100. The patterning process can comprise a lithography step followed by an etching step. Other suitable techniques, such as sidewall image transfer (SIT), self-aligned double patterning (SADP), self-aligned quadruple patterning (SAQP), self-aligned multiple patterning (SAMP) can be used to pattern the hardmask 110, the first metal layers 104 and the second metal layer 106. In some embodiments, a step-by-step reactive ion etching (RIE) process is performed to sequentially remove portions of the hardmask 110, the first metal layer 104 above the second metal layer 106, the second metal layer 106, and the first metal layer 104 below the second metal layer 106. It should be appreciated that other material removal processes such as inductively coupled plasma (ICP) may be used as an alternative to RIE.

Figure 3A:
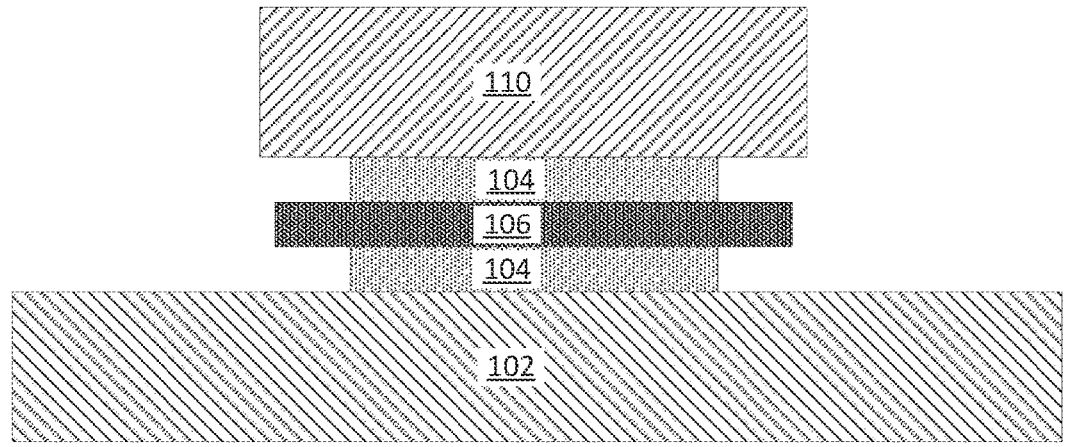
FIG. 3A is a cross-sectional view of the ReRAM device of FIG. 2 at a subsequent stage of the manufacturing process, according to embodiments.
Figure 3B:
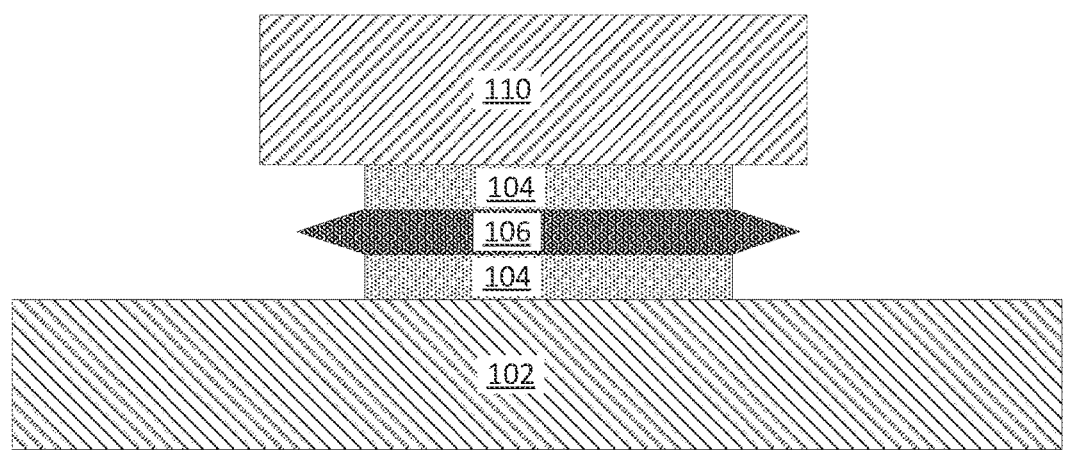
FIG. 3B is a cross-sectional view of the ReRAM device of FIG. 2 at a subsequent stage of the manufacturing process, according to embodiments.

Referring now to FIG. 3A, this figure is a cross-sectional view of the ReRAM device 100 of FIG. 2 at a subsequent stage of the manufacturing process, according to embodiments. As shown in FIG. 3A, an etching process is performed on the first metal layer 104 and the second metal layer 106. An appropriate etchant is selected so that the first metal layer 104 is highly selectively laterally etched relative to the second metal layer 106. Thus, as shown in FIG. 3A, the high etching selectivity results in more material of the first metal layer 104 being removed relative to the second metal layer 106, resulting in indentations being formed in the first metal layer 104 (i.e., tips of the second metal layer 106 sticking out from the edges (or lateral ends) of the first metal layer 104), and the second metal layer 106 is barely etched. As shown in FIG. 3B, in certain embodiments, the etching selectivity of the first metal layer 104 is more moderate that in the case of FIG. 3A, and the tips of the second metal layer 106 may be thinned (or sharpened) by the etching process. This may an effect of further focusing the location of the filament formation in the ReRAM device 100. It should be appreciated that other suitable shapes of the protruding tips (or tip shaped portions) of the second metal layer 106 may be formed other than a sharpened point (or a tapered profile in cross-section). In some embodiments, the first metal layer comprises TiAlC and the second metal comprises Ti-rich TiN, an aqueous solution containing ammonia ($NH_4OH$), hydrogen peroxide ($H_2O_2$) and water ($H_2O$) can be used to etch TiAlC selective to Ti-rich TiN with an etch selectivity greater than 100:1. That is the first metal layer 104 has a higher etching selectivity relative to the second metal layer. The lateral dimension of the indentation can range, for example, from 5 nm to 20 nm.

Figure 4:
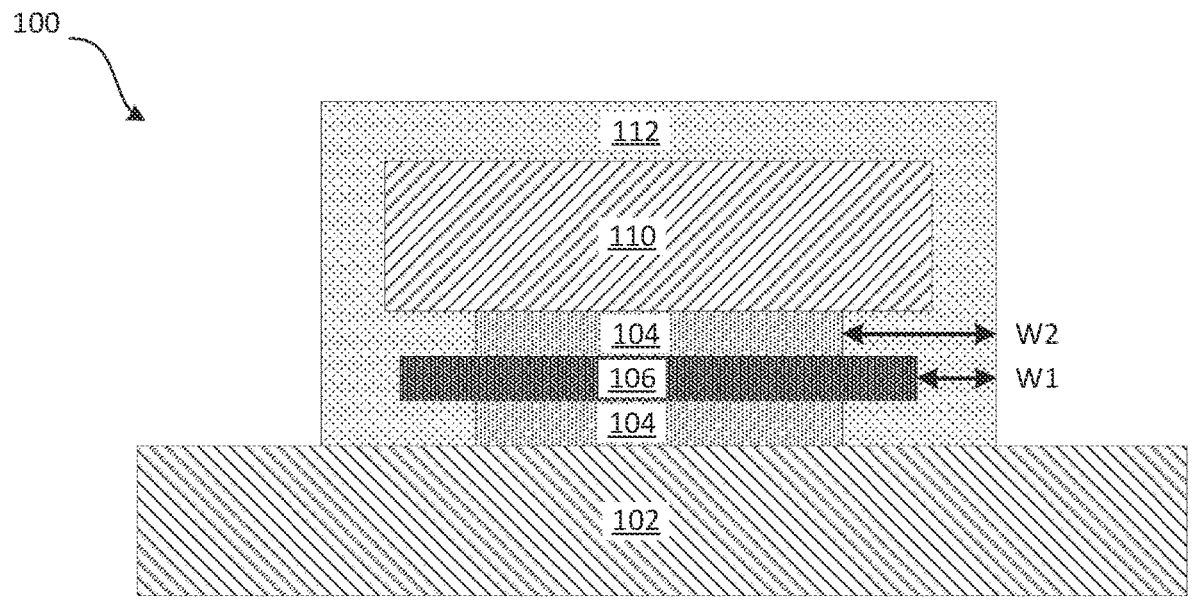
FIG. 4 is a cross-sectional view of the ReRAM device of FIG. 3A at a subsequent stage of the manufacturing process, according to embodiments.

Referring now to FIG. 4, this figure is a cross-sectional view of the ReRAM device 100 of FIG. 3 at a subsequent stage of the manufacturing process, according to embodiments. As shown in FIG. 4, a resistive switching element layer 112 is conformally deposited on and around the substrate 102, the hardmask 110, the first metal layer 104 and the second metal layer 106. The material of the resistive switching element layer 112 fills in the spaces (i.e., gaps, indentations) where the second metal layer 106 protrudes out laterally beyond the edges of the first metal layer 104. In other words, the resistive switching element layer 112 pinches off the indentation, resulting in a greater lateral width of the resistive switching element layer 112 in the indentation region (see, W2 in FIG. 4), and a lesser lateral width of the resistive switching element layer 112 in the non-indent regions (see, W1 in FIG. 4). In certain embodiments, the resistive switching element layer 112 may include or comprise an oxide material such as hafnium oxide ($HfO_x$ where $1<x<2$) although other suitable materials such as tantalum oxide, titanium oxide, nickel oxide, cerium oxide, praseodymium oxide and combinations thereof, etc. may be used. The material of the resistive switching element layer 112 may be deposited using ALD or CVD processing.

Figure 5:
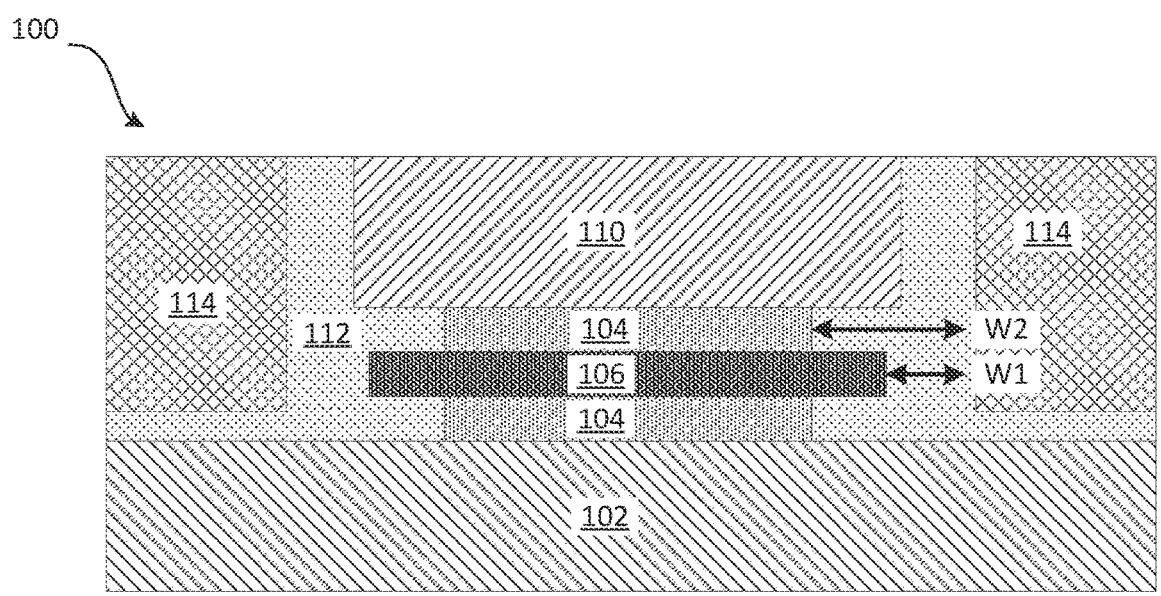
FIG. 5 is a cross-sectional view of the ReRAM device of FIG. 4 at a subsequent stage of the manufacturing process, according to embodiments.

Referring now to FIG. 5, this figure is a cross-sectional view of the ReRAM device 100 of FIG. 4 at a subsequent stage of the manufacturing process, according to embodiments. As shown in FIG. 5, after the formation of the resistive switching element layer 112, a conductive material is deposited to form a second electrode 114. The second electrode 114 may include TiN, TaN, although other suitable materials such as tungsten (W), cobalt (Co), Copper (Cu), ruthenium (Ru), platinum (Pt), tantalum (Ta), nickel (Ni), etc. may be used. A planarization process such as CMP is performed to planarize the top surfaces of the second electrode 114, the resistive switching element layer 112 and the hardmask 110. As such, as shown in FIG. 5, the material of the resistive switching element layer 112 is partially removed to expose the upper surface of the hardmask 110.

Figure 6:
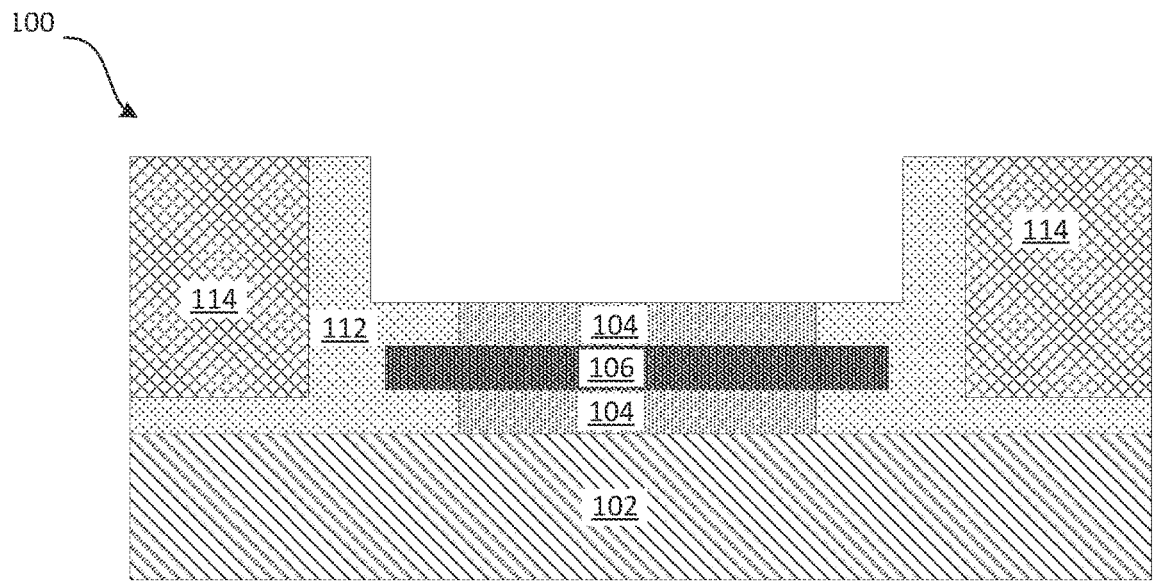
FIG. 6 is a cross-sectional view of the ReRAM device of FIG. 5 at a subsequent stage of the manufacturing process, according to embodiments.

Referring now to FIG. 6, this figure is a cross-sectional view of the ReRAM device 100 of FIG. 5 at a subsequent stage of the manufacturing process, according to embodiments. As shown in FIG. 6, after the formation of the second electrode 114, the hardmask 110 is removed. The hardmask 110 may be removed with any suitable material removal process such as wet etching, plasma etching, and/or RIE. As shown in FIG. 6, after the removal of the hardmask 110, the inner sidewalls of the resistive switching element layer 112 are exposed.

Figure 7:
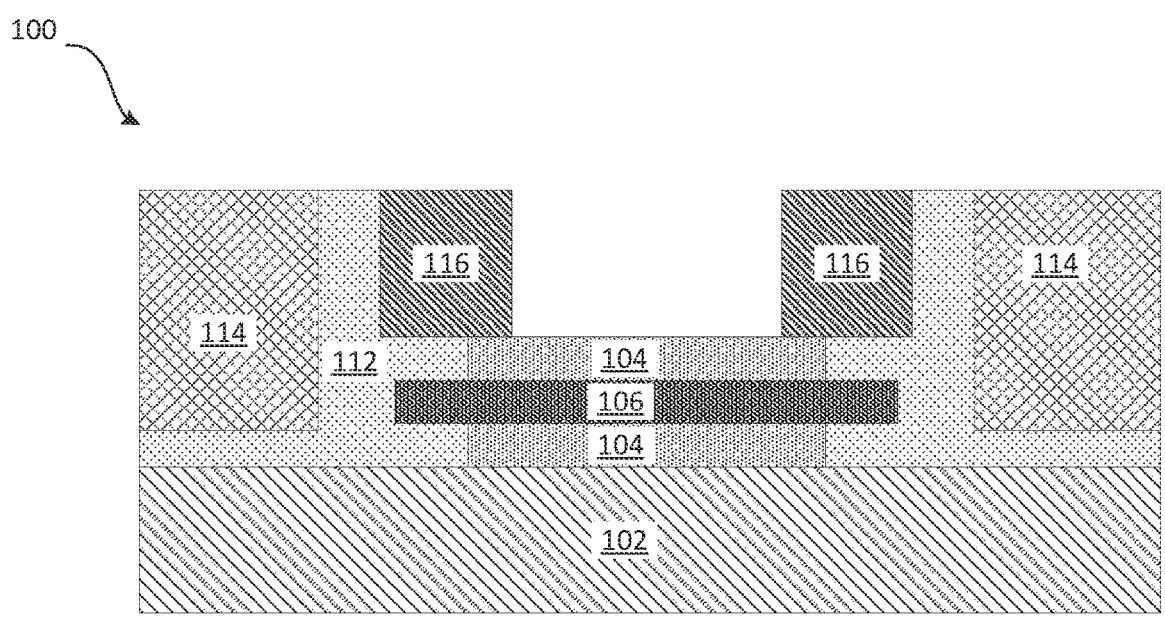
FIG. 7 is a cross-sectional view of the ReRAM device of FIG. 6 at a subsequent stage of the manufacturing process, according to embodiments.

Referring now to FIG. 7, this figure is a cross-sectional view of the ReRAM device 100 of FIG. 6 at a subsequent stage of the manufacturing process, according to embodiments. As shown in FIG. 7, a dielectric spacer layer 116 (or spacer layer) is formed on the exposed sidewalls of the resistive switching element layer 112. In certain embodiments, the dielectric spacer layer 116 may be formed over portions of both the resistive switching element layer 112 and the first metal layer 104, as shown in FIG. 7. Any suitable combination of material deposition and patterning may be used to form the dielectric spacer layer. In some embodiments, the dielectric spacer is formed by a deposition process followed by a RIE process. The dielectric spacer layer 116 may be formed of any suitable dielectric material, including but not limited to, silicon nitride (SiN), silicon carbide (SiC), silicon oxynitride (SiON), carbon-doped silicon oxide (SiOC), fluorine-doped silicon oxide (SiO:F), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. Spacers can be deposited by any suitable techniques such as atomic layer deposition (ALD) or chemical vapor deposition (CVD). After the deposition of the dielectric material, a directional etch such as RIE can be used to remove the dielectric material on horizontal surfaces of layers 114, 112 and 104, leaving the dielectric spacer layer 116 on the sidewalls of 112.

Figure 8A:
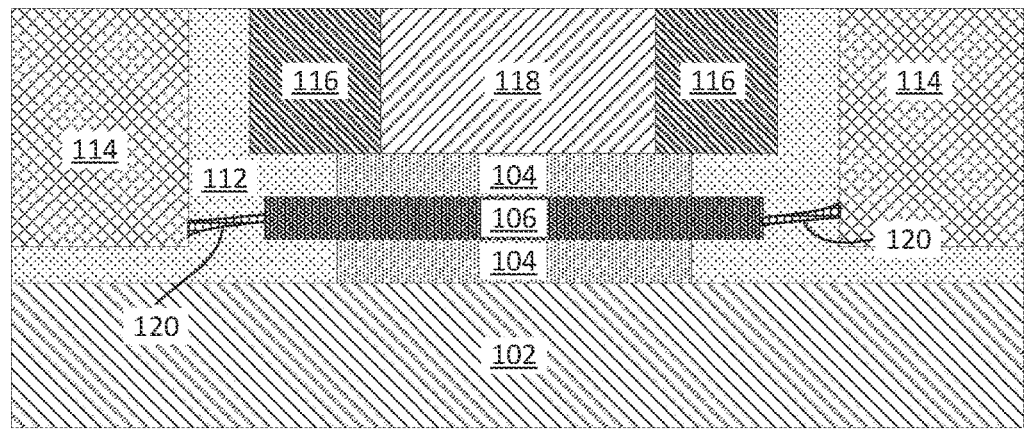
FIG. 8A is a cross-sectional view of the ReRAM device of FIG. 7 at a subsequent stage of the manufacturing process, according to embodiments.
Figure 8B:
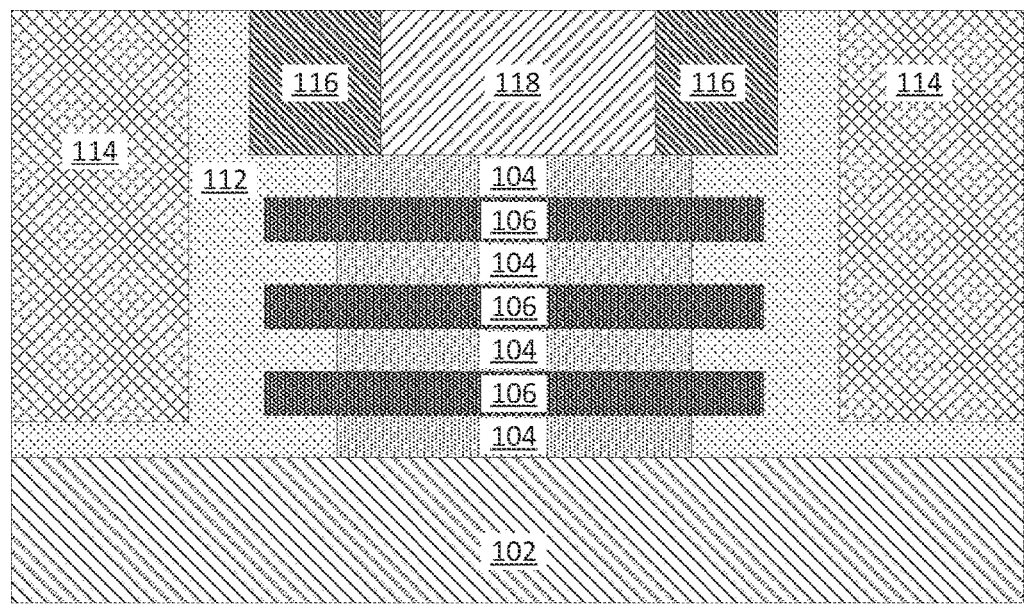
FIG. 8B is a cross-sectional view of the ReRAM device of FIG. 7 at a subsequent stage of the manufacturing process, according to embodiments.

Referring now to FIG. 8A, this figure is a cross-sectional view of the ReRAM device 100 of FIG. 7 at a subsequent stage of the manufacturing process, according to embodiments. As shown in FIG. 8A, third metal layer 118 (or metal fill layer) is formed between the dielectric spacer layer 116 and on top of the uppermost first metal layer 104. The third metal layer 118 can be formed by any suitable deposition process (e.g., CVD) followed by a planarization process (e.g., CMP). In certain embodiments, it may be considered that the combination of the first metal layer 104, the second metal layer 106 and the third metal layer 118 constitutes a first electrode of the ReRAM device 100. In certain embodiments, the third metal layer 118 may include tungsten. However, the third metal layer 118 may be formed any other suitable material or combination of materials such as TiN, TaN, tantalum (Ta), copper (Cu), cobalt (Co), aluminum (Al), ruthenium (Ru), platinum (Pt), tantalum (Ta), nickel (Ni), etc. may be used. FIG. 8B is a cross-sectional view of the ReRAM device 100 of FIG. 7 at a subsequent stage of the manufacturing process, according to other embodiments where there is a plurality of stacked and alternating first metal layers 104 and second metal layers 106.

As discussed above, an essential ReRAM mechanism is based on the formation and rupture of a nanoscale conducting filament typically formed between two electrodes that results in repeatable resistive switching between a high-resistance state and low-resistance state. A drawback of the ReRAM mechanism is that it relies on randomness, and the position of the conducting filament is not under control. Therefore, the present embodiments provide improved designs and techniques for formation of ReRAM devices by focusing the location for filament formation around the protruding tips of the second metal layer 106. This may be achieved due the sharp tip of the Ti-rich TiN (for example) second metal layer 106 to enhance the electrical field at the tip, and due to the reduced lateral dimension (W1) of the resistive switching element layer 112 around the tips. The present embodiments have a thinner dielectric right next to the laterally extended electrode tip and a thicker dielectric around it so that electrical field is highest next to the tip and reduces quickly when slightly away from the tip. As a result, it may be possible to confine the filament formation next to the tip without introducing a reliability issue.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A resistive random access memory (ReRAM) device comprising:
   a first electrode including a first conductive layer sandwiching a second conductive layer, the second conductive layer being wider than the first conductive layer;
   a resistive switching element layer formed in contact with sidewalls of the first electrode, a first portion of the resistive switching element layer that is in contact with the sidewalls of the first conductive layer having a width that is greater than a second portion of the resistive switching element layer that is in contact with the sidewalls of the second conductive layer; and
   a second electrode that is in contact with the resistive switching element layer.

2. The ReRAM device of claim 1, wherein the second conductive layer includes tip shaped portions on lateral ends thereof.

3. The ReRAM device of claim 2, wherein the tip shaped portions have a tapered profile.

4. The ReRAM device of claim 1, further comprising a spacer layer formed on the resistive switching element layer and portions of the first conductive layer.

5. The ReRAM device of claim 4, wherein the spacer layer includes a dielectric material.

6. The ReRAM device of claim 1, wherein the first conductive layer includes TiAlC and the second conductive layer includes Ti-rich TiN.

7. The ReRAM device of claim 1, wherein the first conductive layer has a higher etching selectivity relative to the second conductive layer.

8. The ReRAM device of claim 1, wherein the first electrode includes a third conductive layer formed on an upper surface of the first conductive layer.

9. The ReRAM device of claim 1, wherein the resistive switching elements layer comprises at least one selected from the group consisting of $HfO_x$, $TaO_x$, $AlO_x$, $ZrO_x$, $TiO_x$.

10. The ReRAM device of claim 1, wherein the first electrode includes at least three first conductive layers alternating with at least two second conductive layers.

11. A method of fabricating a resistive random access memory (ReRAM) device, the method comprising:
    forming a first electrode including a first conductive layer sandwiching a second conductive layer, the second conductive layer being wider than the first conductive layer;
    forming a resistive switching element layer in contact with sidewalls of the first electrode, a first portion of the resistive switching element layer that is in contact with the sidewalls of the first conductive layer having a width that is greater than a second portion of the resistive switching element layer that is in contact with the sidewalls of the second conductive layer; and
    forming a second electrode that is in contact with the resistive switching element layer.

12. The method of fabricating a ReRAM device according to claim 11, wherein the second conductive layer includes tip shaped portions on lateral ends thereof.

13. The method of fabricating a ReRAM device according to claim 12, wherein the tip shaped portions have a tapered profile.

14. The method of fabricating a ReRAM device according to claim 11, further comprising forming a spacer layer on the resistive switching element layer and portions of the first conductive layer.

15. The method of fabricating a ReRAM device according to claim 14, wherein the spacer layer includes a dielectric material.

16. The method of fabricating a ReRAM device according to claim 11, wherein the first conductive layer includes TiAlC and the second conductive layer includes Ti-rich TiN.

17. The method of fabricating a ReRAM device according to claim 11, wherein the first conductive layer has a higher etching selectivity relative to the second conductive layer.

18. The method of fabricating a ReRAM device according to claim 11, wherein the first electrode includes a third conductive layer formed on an upper surface of the first conductive layer.

19. The method of fabricating a ReRAM device according to claim 11, wherein the resistive switching elements layer comprises at least one selected from the group consisting of $HfO_x$, $TaO_x$, $AlO_x$, $ZrO_x$, $TiO_x$.

20. The method of fabricating a ReRAM device according to claim 11, wherein the first electrode is a stacked structure that includes at least three first conductive layers alternating with at least two second conductive layers.

* * * * *